United States Patent
Ramanathan et al.

(10) Patent No.: US 8,530,346 B2
(45) Date of Patent: Sep. 10, 2013

(54) PROCESS OF FORMING AN ELECTRONIC DEVICE INCLUDING A CONDUCTIVE STUD OVER A BONDING PAD REGION

(75) Inventors: Lakshmi N. Ramanathan, Chandler, AZ (US); Tien Yu T. Lee, Phoenix, AZ (US); Jinbang Tang, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 77 days.

(21) Appl. No.: 12/901,854

(22) Filed: Oct. 11, 2010

(65) Prior Publication Data

US 2011/0027984 A1    Feb. 3, 2011

Related U.S. Application Data

(62) Division of application No. 11/501,096, filed on Aug. 7, 2006, now Pat. No. 7,812,448.

(51) Int. Cl.
*H01L 21/44* (2006.01)

(52) U.S. Cl.
USPC .......... 438/613; 257/737; 257/751; 257/758; 257/E21.476; 257/E21.508; 438/113; 438/612

(58) Field of Classification Search
USPC .......... 257/758, E21.508, 737, 751, E21.476; 438/612, 613, 113, 12
See application file for complete search history.

(56) References Cited

U.S. PATENT DOCUMENTS

| | | | |
|---|---|---|---|
| 6,426,556 B1 | 7/2002 | Lin | |
| 6,531,384 B1 | 3/2003 | Kobayashi et al. | |
| 6,803,302 B2 | 10/2004 | Pozder et al. | |
| 6,936,923 B2 | 8/2005 | Lin et al. | |
| 6,943,434 B2 | 9/2005 | Tangpuz et al. | |
| 6,958,546 B2 | 10/2005 | Fan et al. | |
| 7,312,535 B2 | 12/2007 | Takewaki et al. | |
| 2002/0127836 A1* | 9/2002 | Lin et al. | 438/612 |
| 2002/0163083 A1* | 11/2002 | Hatano et al. | 257/762 |
| 2004/0188851 A1* | 9/2004 | Takewaki et al. | 257/774 |
| 2006/0027933 A1 | 2/2006 | Chen et al. | |
| 2006/0033214 A1* | 2/2006 | Tomono | 257/772 |

OTHER PUBLICATIONS

Liang, S. W. et al., "3-D Simulation on Current Density Distribution in Flip-Chip Solder Joints with Thick Cu UBM Under Current Stressing", 2005 Electron Components and Technology Conference, Jun. 2005, pp. 1416-1420, Lake Buena Vista, FL, IEEE ISSN 0569-5503.
Matsuki, H. et al., "Super CSP: A BGA Type Real Chip Size Package Using a New Encapsulation Method," Pan Pacific Miceroelectronics Symposium, (3rd : 1998), pp. 415-419.
Murakami, N. et al., "Development of Real CSP Unsing Wafer Level Assembly Process", in Proc. 4th VLSI Packag. Workshop, Kyoto, Japan, 1998, pp. 114-115.

* cited by examiner

*Primary Examiner* — Lynne Gurley
*Assistant Examiner* — Vernon P Webb

(57) ABSTRACT

An electronic device can include an interconnect level including a bonding pad region. An insulating layer can overlie the interconnect level and include an opening over the bonding pad region. In one embodiment, a conductive stud can lie within the opening and can be substantially encapsulated. In another embodiment, the electronic device can include a barrier layer lying along a side and a bottom of the opening and a conductive stud lying within the opening. The conductive stud can substantially fill the opening. A majority of the conductive stud can lie within the opening. In still another embodiment, a process for forming an electronic device can include forming a conductive stud within the opening wherein from a top view, the conductive stud lies substantially completely within the opening. The process can also include forming a second barrier layer overlying the conductive stud.

20 Claims, 3 Drawing Sheets

PROCESS OF FORMING AN ELECTRONIC DEVICE INCLUDING A CONDUCTIVE STUD OVER A BONDING PAD REGION

CROSS-REFERENCE TO RELATED APPLICATIONS

This is a divisional application of and claims priority under 35 U.S.C. §120 to U.S. patent application Ser. No. 11/501,096 entitled "Electronic Device Including a Conductive Stud Over a Bonding Pad Region and a Process for Forming the Electronic Device," by Ramanathan, filed Aug. 7, 2006, which is assigned to the current assignee hereof and incorporated herein by reference in its entirety.

BACKGROUND

1. Field of the Disclosure

The present disclosure relates to electronic devices, more particularly, to electronic devices that include conductive studs over bonding pad regions and processes for forming them.

2. Description of the Related Art

Solder bumps can be used to mount a die to a package as part of an electronic device. Solder bumps can include an under-bump metallization ("UBM") layer and a solder layer. The solder bump can provide both physical and electrical connection between the die and the package. However, the coefficients of thermal expansion ("CTE") of the die and the package may be different ("CTE mismatch"). Thus, as the electronic device changes temperature, the solder bumps can transfer stress between the die and the package to cause a failure such as die cracking. As such, a connection made with a more ductile bump material can be used across a wider temperature range than a connection made with a less ductile bump material providing the bump connection is sufficiently strong to attach the die and package.

As the die area decreases with succeeding process technology generations, features such as bonding pads and solder bumps also decrease in scale, which can increase current crowding. Electromigration increases with increasing current crowding, and can lead to bump failure. Current crowding also occurs when the current flow is from a material with a relatively lower resistivity to a material with a relatively higher resistivity, such as when current flows from the die to the package through the solder bump. Current crowding can be further exacerbated by a change in direction of the current flow, such as when a current moving along an interconnect level changes direction to flow through a solder bump.

One attempt to improve the situation is to add a copper pillar over the UBM layer. However, the copper is much stiffer than the solder that it replaces and can increase the likelihood of failure due to the CTE mismatch. Another attempt can be to use an Al capping layer over a Cu last metal layer. However, introduction of additional materials increases the complexity and expense of manufacturing by increasing the types of tools and processes required to form the electronic device.

BRIEF DESCRIPTION OF THE DRAWINGS

The present disclosure may be better understood, and its numerous features and advantages made apparent to those skilled in the art by referencing the accompanying drawings. The subject of the disclosure is illustrated by way of example and not limitation in the accompanying figures.

Figure 1:
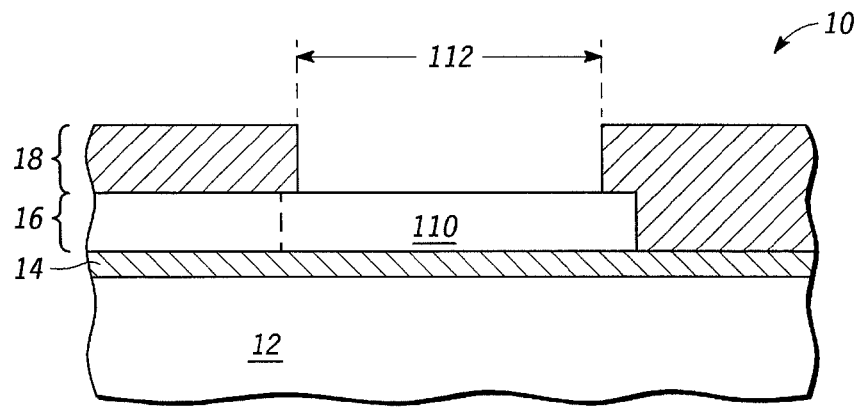
FIG. 1 includes an illustration of a cross-sectional view of a workpiece including an opening in an insulating layer exposing a bonding pad region of an interconnect level.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments described herein. The use of the same reference symbols in different drawings indicates similar or identical items.

DETAILED DESCRIPTION

An electronic device can include an interconnect level including a bonding pad region. The electronic device can also include an insulating layer overlying the interconnect level and including an opening over the bonding pad region. In one embodiment, the electronic device can include a barrier layer lying along a side and a bottom of the first opening. The barrier layer can include a first surface adjacent to the first opening and a second surface opposite the first surface. The second surface can define a second opening. The electronic device can also include a conductive stud lying within the second opening, wherein the conductive stud substantially fills the second opening and a majority of the conductive stud lies within the second opening.

In another embodiment, the electronic device can further include a conductive stud lying within the opening over the bonding pad region, wherein the conductive stud is substantially encapsulated, and a majority of the conductive stud comprises Cu, Ag, Au, Pt, or any combination thereof.

In still another embodiment, a process for forming an electronic device can include forming a first barrier layer within the opening in the insulating layer. The process can also include forming a conductive stud within the opening, wherein from a top view, the conductive stud lies substantially completely within the opening, and forming a second barrier layer overlying the conductive stud.

In accordance with the present disclosure, an electronic device is formed having a conductive stud overlying a bonding pad region. In one embodiment, the conductive stud can have a relatively lower resistivity compared with a solder bump. In accordance with a specific embodiment, the conductive stud can be formed prior to forming a UBM. As a result, a current flowing from the die to the bump can change direction largely within the conductive stud such that current crowding can occur prior to the current entering the solder bump. By forming the novel structure, solder bump failure due to electromigration can be reduced substantially without increasing the effect of an existing CTE mismatch or without increasing the number of materials used in the process. Specific embodiments of the present disclosure will be better understood with reference to FIGS. 1 through 8.

Some terms are defined or clarified as to their intended meaning as they are used within this specification.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

FIG. 1 includes a cross-sectional view of an illustration of a portion of a workpiece 10. The workpiece 10 includes a substrate 12 and an interconnect level 16. An insulating layer 14 lies between the substrate 12 and the interconnect level 16. An insulating layer 18 overlies the interconnect level 16 and the substrate 12. The interconnect level 16 includes a bonding pad region 110, and the insulating layer 18 includes an opening 112 over the bonding pad region 110. The workpiece 10 can include an electronic component such as a resistor, an inductor, a capacitor, a transistor, or the like (not illustrated). The substrate 12 includes a semiconductor element such as silicon, germanium, another semiconductor element, or any combination thereof. The substrate 12 can also include one or more other insulating layers or interconnect layers (not illustrated).

Referring to FIG. 1, the insulating layer 14 is formed using a conventional or proprietary chemical vapor deposition ("CVD") process, physical vapor deposition ("PVD") process, or any combination thereof. The insulating layer 14 has a thickness in a range of approximately 100 to approximately 5000 nm and includes an oxide, a nitride, an oxynitride, or any combination thereof. The insulating layer 14 can include an opening (not illustrated) such that a portion of the interconnect level 16 can be electrically connected to a portion of the substrate 12. The interconnect level 16 can be formed using a conventional or proprietary CVD process, PVD process, plating process, or any combination thereof. In one embodiment, the interconnect level 16 is formed by depositing, patterning and etching. In another embodiment, the interconnect level 16 is formed by depositing and chemical mechanical polishing ("CMP"). The interconnect level 16 can have a thickness in a range of approximately 100 to approximately 3000 nm and include Al, Cu, Cr, Ti, Ta, W, or any combination thereof. In one embodiment, a majority of the interconnect level 16 is formed of Cu. Conductive plugs (not illustrated) may be used to electrically connect interconnects with other interconnects, electronic components, the substrate 12, or any combination thereof at other levels within the workpiece 10.

Still referring to FIG. 1, the insulating layer 18 can be formed using a material and process as previously described for the insulating layer 14. In one embodiment, the insulating layer 18 has a thickness greater than approximately 1000 nm. In a particular embodiment, the insulating layer 18 includes a nitride layer, an oxynitride layer, or any combination thereof, and serves as a final passivation layer for the electronic device. The opening 112 is formed over the bonding pad region 110 of the interconnect level 16 using a conventional or proprietary process. In one embodiment, a sacrificial layer (not illustrated) or a resist layer (not illustrated) is used to protect the portions of the insulating layer 18 that are to remain. Exposed portions of the insulating layer 18 are removed to expose the bonding pad region 110 and the sacrificial or resist layer is then removed.

Figure 2:
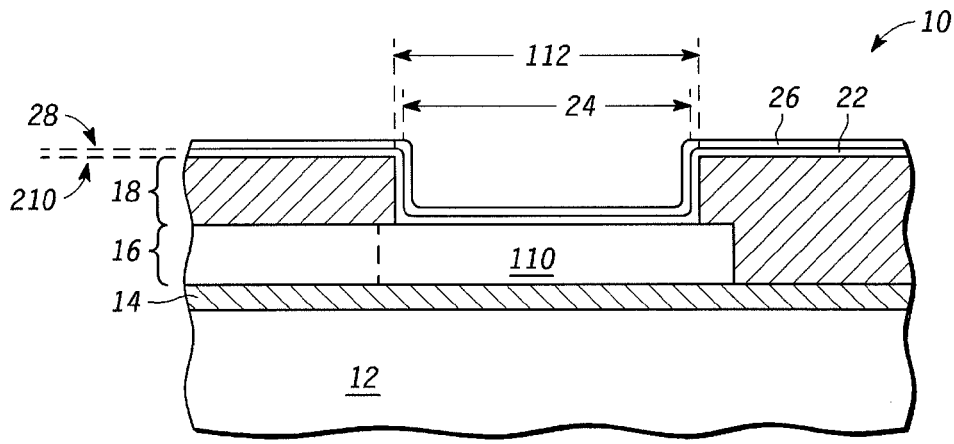
FIG. 2 includes an illustration of a cross-sectional view of the workpiece of FIG. 1 after forming a first barrier layer and a seed layer.

FIG. 2 includes an illustration of a cross-sectional view of the workpiece 10 after forming a barrier layer 22 and an opening 24. The barrier layer 22 can serve to substantially prevent intermixing of the material of the bonding pad region 110 with a subsequently deposited material. The barrier layer 22 can have a surface 210 adjacent to the opening 112 and a surface 28, opposite the surface 210. In one embodiment, the barrier layer 22 lies along a side and a bottom of the opening 112. The surface 28 defines the opening 24 within the opening 112. In one embodiment, a seed layer 26 lies along the surface 28. The seed layer 26 includes a conductive layer. The barrier layer 22, the seed layer 26, or any combination thereof is formed using a conventional or proprietary CVD process, PVD process, or any combination thereof. The barrier layer 22 can include Ti, Ta, W, Pt, Pd, Cr, or any combination thereof and have a thickness in a range of approximately 5 to approximately 500 nm. The seed layer 26 can include Cu, Ni, Au, Ag, V, another seed material suitable for plating, or any combination thereof and have a thickness in a range of approximately 10 to approximately 600 nm.

Figure 3:
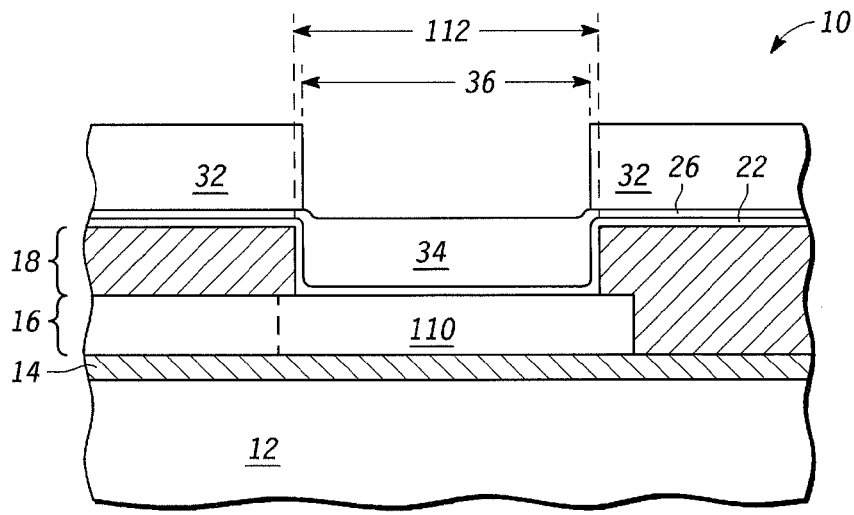
FIG. 3 includes an illustration of a cross-sectional view of the workpiece of FIG. 2 after forming a conductive layer within an opening in a sacrificial layer.

FIG. 3 includes an illustration of the workpiece 10 of FIG. 2 after forming a sacrificial layer 32, including an opening 36, and a conductive stud 34. In one embodiment, the sacrificial layer 32 can be formed with the opening 36 overlying the opening 112, the opening 24, the bonding pad region 110, or any combination thereof. The sacrificial layer 32 can be formed using a conventional or proprietary lithographic process. The sacrificial layer 32 can be an insulating material or a resist material that can substantially prevent contact between covered portions of the seed layer 26 and a plating solution. In one embodiment, the conductive stud 34 includes Ag, Au, Cu, Pt, or any combination thereof. In another embodiment, the exposed portions of the seed layer 26 are plated using a conventional or proprietary process to substantially fill the opening 24 and form the conductive stud 34.

Figure 4:
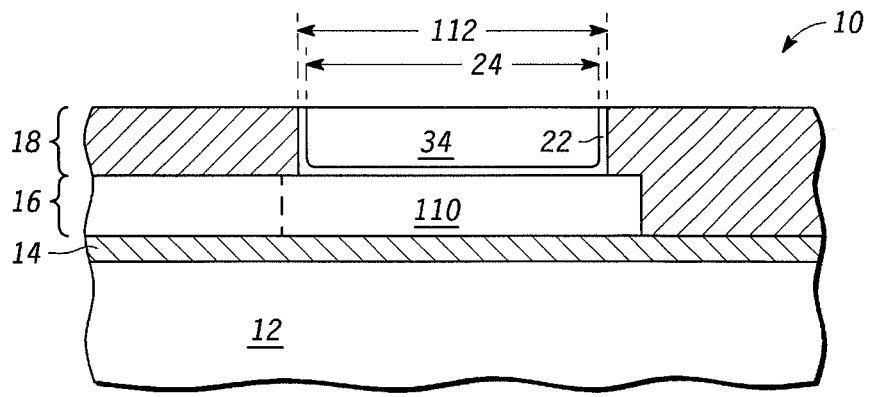
FIG. 4 includes an illustration of a cross-sectional view of the workpiece of FIG. 3 after removing exposed portions of the first barrier layer and the seed layer.

FIG. 4 includes an illustration of the workpiece 10 of FIG. 3 after removing exposed portions of the barrier layer 22. After forming the conductive stud 34 over the bonding pad region 110 as previously discussed, the sacrificial layer 32 is removed using a conventional or proprietary process. Exposed portions of the barrier layer 22 and the seed layer 26, if any, are then removed to expose the insulating layer 18 using a conventional or proprietary CMP or etch process. In one embodiment, from a top view, substantially all of the conductive stud 34 lies within the opening 112 and the opening 24. In a more particular embodiment, the conductive stud 34 has a thickness greater than approximately 1000 nm. In an even more particular embodiment, the conductive stud 34 has a thickness in a range of approximately 10 um to approximately 75 um. In another embodiment, the conductive stud 34 and the bonding pad region 110 can comprise a substantially same material. In one embodiment, the processing of the workpiece 10 is substantially complete. In another embodiment, the workpiece 10 can be processed further.

Figure 5:
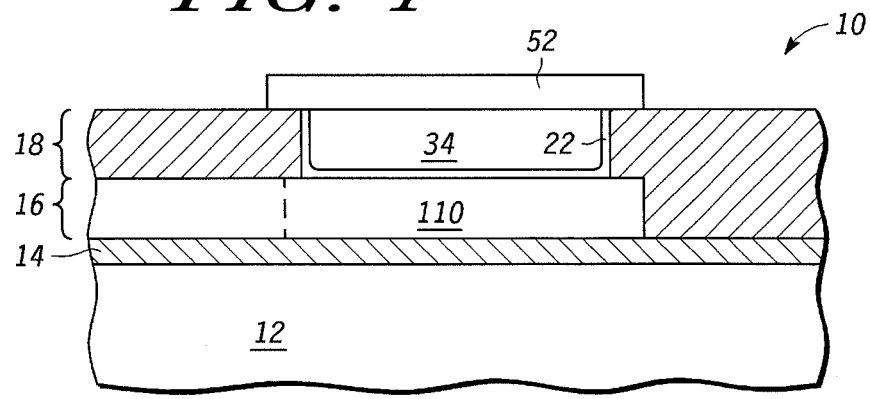
FIG. 5 includes an illustration of a cross-sectional view of the workpiece of FIG. 4 after forming a second barrier layer.

FIG. 5 includes an illustration of the workpiece 10 of FIG. 4 after forming a barrier layer 52 using a conventional or proprietary CVD process, PVD process, or any combination thereof. In one embodiment, a UBM layer includes the barrier layer 52. In a particular embodiment, the barrier layer 52 lies over the conductive stud 34, and, in a more particular embodiment, the barrier layer 52 lies immediately adjacent to the conductive stud 34. In another embodiment, the barrier layer 52 in conjunction with other layers, such as barrier layer 22, substantially encapsulates conductive stud 34. The barrier layer 52 can have a thickness in a range of approximately 50 to approximately 600 nm and include a material as previously described for the barrier layer 22.

Figure 6:
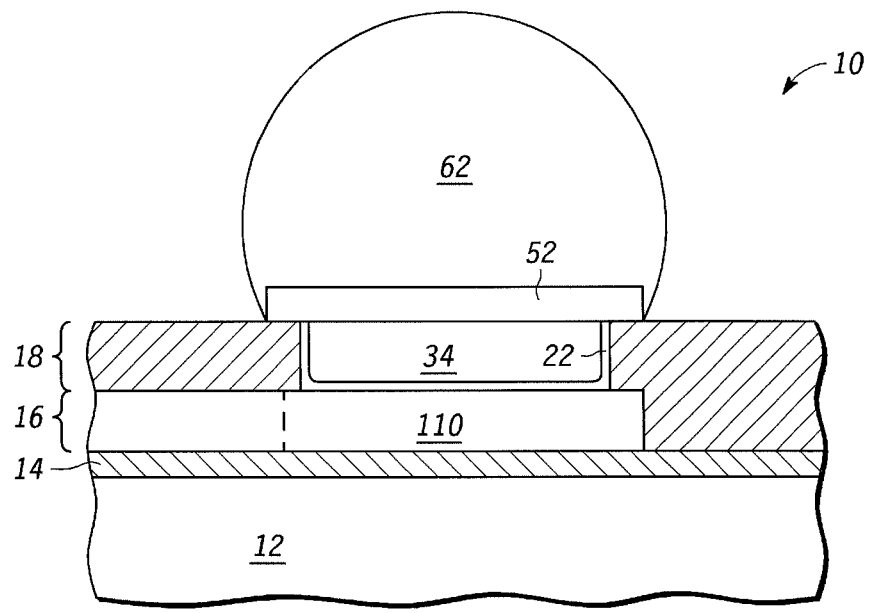
FIG. 6 includes an illustration of a cross-sectional view of the workpiece of FIG. 5 after forming a solder bump.

FIG. 6 includes an illustration of the workpiece 10 of FIG. 5 after forming a substantially complete electronic device. A solder bump 62 can be formed using a conventional or proprietary process such as CVD process, PVD process, plating process, stenciling process, molding process, screen printing process, preformed ball placing process, or any combination thereof. The solder bump 62 includes Pb, Sn, In, Au, Cu, or any combination thereof.

Thus, the conductive stud 34 is formed within the opening 112 over the bonding pad region 110 of the electronic device. By allowing current flow to substantially complete a change of direction prior to exiting the die through a solder bump, current crowding and the resultant electromigration can be reduced within the solder bump. Additional CTE mismatch issues and the associated costs can be avoided by including the conductive stud below the UBM so that a standard solder bumping process can be used. In one embodiment, Cu can be used as a major component of the conductive stud 34 due to superior current carrying capability over Al.

Figure 7:
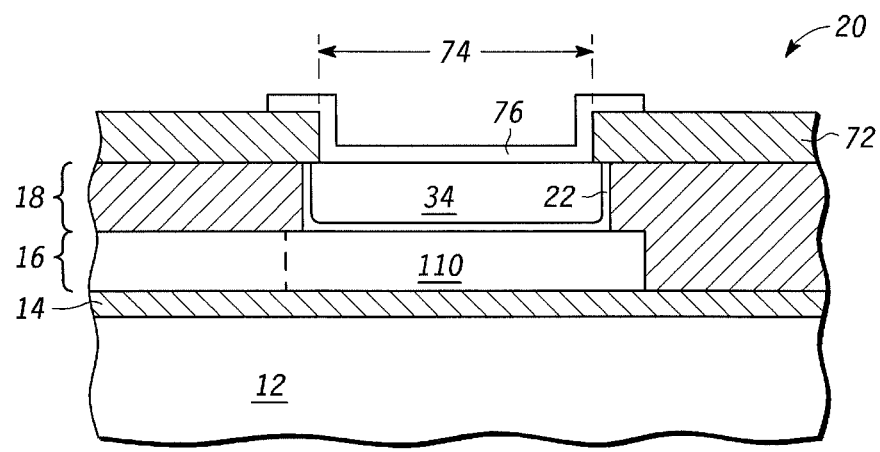
FIG. 7 includes an illustration of a cross-sectional view of a workpiece of FIG. 4 after forming a barrier layer in accordance with an alternative embodiment.

In accordance with another embodiment, FIG. 7 includes an illustration of a workpiece 20 including a passivation layer 72, an opening 74 and a barrier layer 76. The workpiece 20 is similar to the workpiece 10 and further includes differences as noted in the following. Processing proceeds as previously described for the workpiece 10 and the FIGS. 1 through 4. The passivation layer 72 is deposited over the workpiece 20 by using a conventional or proprietary CVD or PVD process. The passivation layer 72 has a thickness in a range of approximate 100 nm to approximately 1000 nm. The passivation layer 72 can be formed using any embodiment previously described for the insulating layer 18. In one embodiment, the passivation layer 72 can include a nitrogen-containing compound. The opening 74 is formed to expose the conductive stud 34. The opening 74 can be formed by a conventional or proprietary lithography and etch process. The barrier layer 76 can be formed using an embodiment or including any material previously described for the barrier layer 52 in FIG. 5. Processing can proceed as previously described for FIG. 6 to form a substantially complete electronic device.

Figure 8:
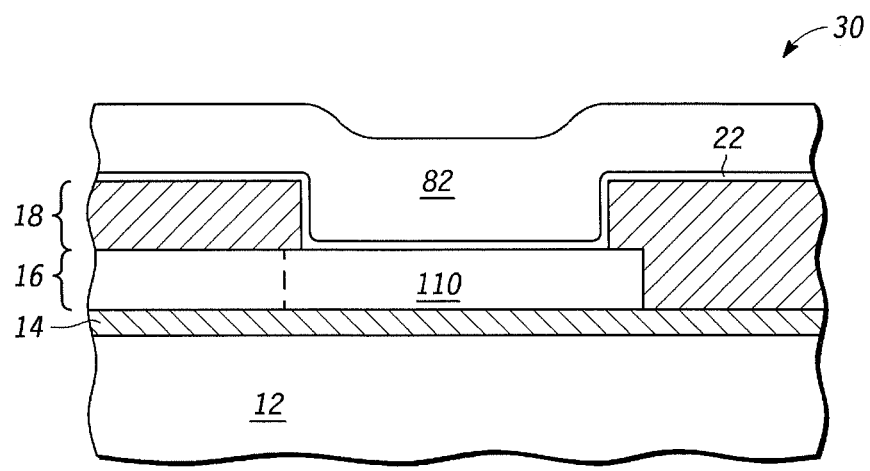
FIG. 8 includes an illustration of a cross-sectional view of a workpiece of FIG. 2 after forming a conductive layer in accordance with an alternative embodiment.

In accordance with still another embodiment, FIG. 8 includes an illustration of a workpiece 30 after forming a conductive layer 82. The workpiece 30 is similar to the workpiece 10 and further includes differences as noted in the following. Processing begins as previously described with respect to FIGS. 1 and 2. The seed layer 26 may, or may not be present. The conductive layer 82 can be deposited using a conventional or proprietary CVD, PVD, or plating process. In one embodiment, the conductive layer 82 includes the seed layer 26. In a particular embodiment, the thickness of layer 82 has a range of approximately 10 um to approximately 75 um. A longer CMP or etch process is used to remove both the conductive layer 82 as well as the barrier layer 22 outside of the opening 24 to form a structure similar to the one illustrated in FIG. 4. Processing proceeds according to an embodiment previously described with respect to FIG. 5 or 7 through FIG. 6 to form a substantially complete electronic device.

Many different aspects and embodiments are possible. Some of those aspects and embodiments are described below. After reading this specification, skilled artisans will appreciate that those aspects and embodiments are only illustrative and do not limit the scope of the present invention.

To the extent not described herein, many details regarding specific materials, processing acts, and circuits are conventional and may be found in textbooks and other sources within the semiconductor and microelectronic arts. Other features and advantages of the invention will be apparent from the following detailed description, and from the claims.

In a first aspect an electronic device can include an interconnect level including a bonding pad region, and an insulating layer overlying the interconnect level and including a first opening over the bonding pad region. The electronic device can also include a barrier layer lying along a side and a bottom of the first opening. The barrier layer includes a first surface adjacent to the first opening, and a second surface opposite the first surface and defining a second opening. The electronic device can also include a conductive stud lying within the second opening, wherein the conductive stud substantially fills the second opening, and a majority of the conductive stud lies within the second opening.

In one embodiment of the first aspect, substantially all of the conductive stud lies within the second opening. In another embodiment of the first aspect, the insulating layer includes a nitride layer, an oxynitride layer, or any combination thereof. In still another embodiment, the conductive stud includes Ag, Au, Cu, Pt, or any combination thereof. In yet another embodiment, the conductive stud has a height of greater than approximately 1 micron.

In a second aspect, an electronic device can include an interconnect level including a bonding pad region, and an insulating layer overlying the interconnect level and including an opening over the bonding pad region. The electronic device can also include a conductive stud lying within the opening over the bonding pad region, wherein the conductive stud is substantially encapsulated, and a majority of the conductive stud includes Cu, Ag, Au, Pt, or any combination thereof.

In a particular embodiment of the second aspect, the electronic device can further include a first barrier layer lying between the conductive stud and the bonding pad region of the interconnect layer. In a more particular embodiment, the electronic device can further include a second barrier layer overlying and immediately adjacent to the conductive stud. In still another embodiment, an under-bump metallization layer includes the second barrier layer. In yet another embodiment, the insulating layer includes a nitride, an oxynitride, or any combination thereof.

In another embodiment of the second aspect, the insulating layer is greater than approximately 1 micron in thickness. In still another embodiment of the second aspect, from a top view, the conductive stud lies substantially completely within the opening in the insulating layer.

In a third aspect, a process for forming an electronic device can include forming an interconnect level over a substrate, wherein the interconnect level further includes a bonding pad region. The process can also include forming an insulating layer overlying the interconnect level, and forming an opening in the insulating layer to expose the bonding pad region. The process can further include forming a first barrier layer within the opening, and forming a conductive stud within the opening, wherein from a top view, the conductive stud lies substantially completely within the opening. The process can also include forming a second barrier layer overlying the conductive stud.

In one embodiment of the third aspect, forming the insulating layer includes forming a nitride layer. In another embodiment, the process further includes forming a seed layer after forming the first barrier layer. In a particular embodiment, forming the conductive stud includes plating a conductive layer. In a more particular embodiment, forming the conductive stud includes, forming a sacrificial layer including an opening over the bonding pad region prior to plating the conductive layer. Forming the conductive stud can also include removing the sacrificial layer after plating the conductive layer, and removing exposed portions of the first barrier layer and the seed layer after plating the conductive layer. In a still more particular embodiment, removing the exposed portions of the first barrier layer includes using a chemical mechanical polishing process.

In another embodiment of the third aspect, the process can further include forming a passivation layer including an opening over the bonding pad region, after forming the conductive stud, and prior to forming the second barrier layer. In still another embodiment, the second barrier layer is a part of an under-bump metallization layer immediately adjacent to the conductive stud.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining which one or more activities or one or more portions thereof are used or not used and the order of such activities are to be performed for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process of forming an electronic device comprising:
    forming an interconnect level over a substrate, wherein the interconnect level further includes a bonding pad region;
    forming an insulating layer overlying the interconnect level;
    forming an opening in the insulating layer to expose the bonding pad region;
    forming a first barrier layer within the opening;
    forming a conductive stud within the opening, wherein from a top view, substantially all of the conductive stud lies within the opening; and
    forming a second barrier layer overlying the conductive stud, wherein the conductive stud is substantially encapsulated by the first and second barrier layers; and forming a solder bump over the second barrier layer, the conductive stud, and the bonding pad region of the interconnect level, wherein the solder bump is spaced apart from the conductive stud and the bonding pad region of the interconnect level.

2. The process of claim 1, further comprising forming a seed layer after forming the first barrier layer.

3. The process of claim 2, wherein forming the conductive stud comprises plating a conductive layer.

4. The process of claim 3, wherein forming the conductive stud comprises:
    forming a sacrificial layer including an opening over the bonding pad region prior to plating the a conductive layer;
    removing the sacrificial layer after plating the conductive layer; and
    removing exposed portions of the first barrier layer and the seed layer after plating the conductive layer.

5. The process of claim 4, wherein removing the exposed portions of the first barrier layer includes using a chemical mechanical polishing process.

6. The process of claim 1, further comprising forming a passivation layer including an opening over the bonding pad region, after forming the conductive stud, and prior to forming the second barrier layer.

7. The process of claim 1, wherein the second barrier layer is a part of an under-bump metallization layer immediately adjacent to the conductive stud.

8. The process of claim 1, wherein forming the solder bump is performed such that substantially none of the solder bump lies within the opening of the insulating layer.

9. The process of claim 8, wherein forming the second barrier layer is performed such that substantially none of the second barrier layer lies within the opening of the insulating layer.

10. The process of claim 1, wherein:
    forming the second barrier layer is part of forming an under-bump metallization layer having uppermost and side surfaces, wherein the bonding pad region is farther from the uppermost surface than the side surface; and
    forming the solder bump is performed such that the solder bump abuts the side surface of the underbump metallization layer at a location that does not overlie the conductive stud.

11. A process for forming an electronic device comprising:
    forming an interconnect level including a bonding pad region;
    forming an insulating layer overlying the interconnect level and including an opening over the bonding pad region;
    forming a conductive stud lying within the opening over the bonding pad region, wherein substantially all of the conductive stud lies within the opening;
    forming a barrier layer over the conductive stud; and
    forming a solder bump over the barrier layer, the conductive stud, and the bonding pad region of the interconnect level, wherein the solder bump is spaced apart from the conductive stud and the bonding pad region of the interconnect level.

12. The process of claim 11, wherein forming the insulating layer includes forming a nitride layer.

13. The process of claim 11, wherein forming the solder bump is performed such that substantially none of the solder bump lies within the opening of the insulating layer.

14. The process of claim 13, wherein forming the barrier layer is performed such that substantially none of the barrier layer lies within the opening of the insulating layer.

15. The process of claim 11, wherein:
forming the barrier layer is part of forming an underbump metallization layer having uppermost and side surfaces, wherein the bonding pad region is farther from the uppermost surface than the side surface; and
forming the solder bump is performed such that the solder bump abuts the side surface of the underbump metallization layer at a location that does not overlie the conductive stud.

16. The process of claim 11, further comprising forming a seed layer after forming the first barrier layer.

17. The process of claim 16, wherein forming the conductive stud comprises plating a conductive layer.

18. The process of claim 17, wherein forming the conductive stud comprises plating Ag, Au, Cu, Pt, or any combination thereof.

19. The process of claim 17, wherein forming the conductive stud comprises plating Cu.

20. The process of claim 1, wherein from the top view all of the conductive stud lies within the opening.

* * * * *